(12) United States Patent
Schmidt et al.

(10) Patent No.: US 8,409,472 B2
(45) Date of Patent: *Apr. 2, 2013

(54) RED EMITTING LUMINESCENT MATERIALS

(75) Inventors: Peter J. Schmidt, Aachen (DE); Walter Mayr, Alsdorf (DE); Joerg Meyer, Aachen (DE); Wolfgang Schnick, Gauting (DE); Cora Sieglinde Hecht, Ebersberg (DE); Florian Stadler, Geretsried (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/442,117

(22) Filed: Apr. 9, 2012

(65) Prior Publication Data

US 2012/0194060 A1  Aug. 2, 2012

Related U.S. Application Data

(63) Continuation of application No. 12/525,083, filed on Feb. 5, 2010, now Pat. No. 8,153,025.

(30) Foreign Application Priority Data

Feb. 6, 2007  (EP) ..................................... 07101811

(51) Int. Cl.
*C09K 11/08*  (2006.01)
*H01J 63/04*  (2006.01)

(52) U.S. Cl. ................................. 252/301.4 F; 313/503
(58) Field of Classification Search ............ 252/301.4 F, 252/301.4 R; 313/467, 468, 503
See application file for complete search history.

(56) References Cited

U.S. PATENT DOCUMENTS

| 4,242,221 A * | 12/1980 | Cusano et al. ............... 264/1.21 |
| 6,670,748 B2 | 12/2003 | Ellens et al. |
| 6,680,569 B2 | 1/2004 | Mueller-Mach et al. |
| 7,076,020 B2 | 7/2006 | Kanai et al. |
| 7,445,730 B2 * | 11/2008 | Nagatomi et al. ...... 252/301.4 F |
| 2003/0094893 A1 | 5/2003 | Ellens et al. |
| 2005/0230689 A1 | 10/2005 | Setlur et al. |
| 2009/0026915 A1 * | 1/2009 | Nagatomi et al. ............ 313/503 |

FOREIGN PATENT DOCUMENTS

| EP | 1339109 A2 | 8/2003 |
| EP | 1696016 A1 | 8/2006 |
| WO | 2005049763 A1 | 6/2005 |

(Continued)

OTHER PUBLICATIONS

Mueller-Mach et al "Nitridosilcates, a New Family of Phosphors for Color Conversion of LEDS", Proceedings of the SPIE, vol. 5941, Jan. 1, 2005, p. 1-8.

(Continued)

*Primary Examiner* — Emily Le
*Assistant Examiner* — Lynne Edmondson

(57) ABSTRACT

The invention relates to an improved red light emitting material of the formula $M_{1-y}A_{1+x}Si_{4-x}N_{7-x-2y}O_{x+2y}$:RE whereby M is selected out of the group comprising Ba, Sr, Ca, Mg or mixtures thereof, A is selected out of the group comprising Al, Ga, B or mixtures thereof, RE is selected out of the group comprising rare earth metals, Y, La, Sc or mixtures thereof and x is $\geq 0$ and $\leq 1$ and y is $\geq 0$ and $\leq 0.2$. This material is believed to crystallize in a novel structure type that comprises two individual lattice sites for rare earth metal incorporation, which leads to an improved lighting behaviour.

17 Claims, 4 Drawing Sheets

FOREIGN PATENT DOCUMENTS

| | | | |
|---|---|---|---|
| WO | 2005052087 | A1 | 6/2005 |
| WO | 2005083037 | A1 | 9/2005 |
| WO | 2005103199 | A1 | 11/2005 |
| WO | WO 2005103199 | A1 * | 11/2005 |
| WO | 2006033417 | A1 | 3/2006 |
| WO | WO 2006106883 | A1 * | 10/2006 |
| WO | 2006106883 | A1 | 12/2006 |

OTHER PUBLICATIONS

Lieb et al The Sialons MLn [si4-xA1xOxN7-x] With M=eU, Sr, Ba, and Ln=Ho-Yb-Twelve Substitution Variants With the MYb[Si4N7] Structure Type, Z. Anorg. Allg. Chem 2007, vol. 633 p. 166-171.

* cited by examiner

RED EMITTING LUMINESCENT MATERIALS

CROSS-REFERENCE TO RELATED APPLICATIONS

This is a continuation of U.S. application Ser. No. 12/525,083, filed Feb. 5, 2010, titled "Red Emitting Luminescent Materials," and incorporated herein by reference.

FIELD OF THE INVENTION

The present invention is directed to novel luminescent materials for light emitting devices, especially to the field of novel luminescent materials for LEDs and their use in light emitting devices. The invention also relates to a light emitting device comprising such material and a system comprising light emitting devices.

BACKGROUND OF THE INVENTION

Phosphors comprising silicates, phosphates (for example, apatite) and aluminates as host materials, with transition metals or rare earth metals added as activating materials to the host materials, are widely known. As blue LEDs, in particular, have become practical in recent years, the development of white light sources utilizing such blue LEDs in combination with such phosphor materials is being energetically pursued.

Especially red emitting luminescent materials have been in the focus of interest and several materials have been proposed, e.g. U.S. Pat. No. 6,680,569(B2), "Red Deficiency Compensating Phosphor for a Light Emitting Device", or from WO patent application 2005/052087 A1.

However, there is still the continuing need for red emitting luminescent materials which are usable within a wide range of applications and especially allow the fabrication of phosphor converted (pc) warm white pcLEDs with optimized luminous efficiency and color rendering.

SUMMARY OF THE INVENTION

It is an object of the present invention to provide a material which is usable within a wide range of applications and especially allows the fabrication of phosphor warm white pcLEDs with optimized luminous efficiency and color rendering This object is solved by a material according to claim 1 of the present invention. Accordingly, a material $M_{1-y}A_{1+x}Si_{4-x}N_{7-x-2y}O_{x+2y}$:RE is provided, whereby M is selected out of the group comprising Ba, Sr, Ca, Mg or mixtures thereof A is selected out of the group comprising Al, Ga, B or mixtures thereof.

RE is selected out of the group comprising rare earth metals, Y, La, Sc or mixtures thereof and x is $\geq 0$ and $\leq 1$, and y is $\geq 0$ and $\leq 0.2$.

It should be noted that by the term "$M_{1-y}A_{1+x}Si_{4-x}N_{7-x-2y}O_{x+2y}$:RE" especially and/or additionally any material is meant and/or included, which has essentially this composition.

The term "essentially" means especially that $\geq 95\%$, preferably $\geq 97\%$ and most preferred $\geq 99\%$ wt-%. However, in some applications, trace amounts of additives may also be present in the bulk compositions. These additives particularly include such species known to the art as fluxes. Suitable fluxes include alkaline earth—or alkaline—metal oxides, borates, phosphates and halides such as fluorides, ammonium chloride, $SiO_2$ and the like and mixtures thereof.

Such a material has shown for a wide range of applications within the present invention to have at least one of the following advantages:

Using the material as luminescent material, LEDs may be built which show improved lighting features, especially thermal stability.

The material shows for a wide range of applications an exceptional high chemical stability because of the highly condensed nature of the host lattice The material for a wide range of applications only contains non-toxic and widely available constituents Without being bound to any theory, the inventors believe that the improved properties of the inventive material arise at least partially out of the structure of the material.

It is believed that the inventive material essentially has an orthorhombic structure which comprises three dimensionally connected $SiN_4$ and $AlN_4$ tetrahedra that are linked via corner and edge sharing. The $AlN_4$ tetrahedra built up trans-edge-connected tetraheda chains running along crystallographic c direction that are cross-linked via corner-connecting $SiN_4$ tetrahedra. This leads to channels along c direction where the M cations are built in.

For a wide range of structures within the inventive material there seem exist two crystallographically different "M"-sites (which are within this application called M(1) and M(2)) that are significantly different in size and number of coordinating N ligands. It is believed that red emission especially occurs after excitation of RE incorporated on the smaller M(1) site. Shorter wavelength RE emission resulting from RE on M(2) site may be reabsorbed by RE on M(1) site which then enhances the emission in the red spectral region, e.g. for many structures if RE comprises Eu(II).

For RE comprises Ce(III) it has been found for many structures that the emission are in the yellow-green spectral area; however, the shifts in the emission from one host structure to another are usually analogous to that if RE comprises Eu(II). In case RE comprises Pr(III), green and red emissions are frequently found, if RE comprises Tb(III), emissions are usually green and if RE comprises Sm(III), red emission occurs. For the two latter elements, in accordance with known prior art, the emission lines are for most structures independent of the host structure, since these latter two elements are line emitters.

In addition excitation energy absorbed by RE incorporated on the smaller M(1) site may be transferred to RE on M(1) site by means of energy transfer processes.

Because the M(2) site is large(r) and shows a high coordination number, larger M atoms (such as Ba) are preferentially built in on M(2) site, if they are present. Incorporation of such M atoms such as Ba has been shown to lead to a shift of emission to shorter wavelengths and a narrowing of the emission band for a variety of examples within the inventive material.

Because the M(1) site is smaller than the M(2) site and shows a low coordination number, smaller M atoms (such as Ca) atoms are preferentially built in on M(1) site. Incorporation of such M atoms such as Ca has been shown to lead to a shift of emission to longer wavelengths and a broadening of the emission band for a variety of examples within the inventive material.

Surprisingly as a result, the spectrum may be tuned by adjusting the Ba/Sr/Ca ratio in the lattice.

Further on, it has been found for a large variety of examples within the inventive material that a partial or complete replacement of the Al atoms located in the trans-edge-connected tetrahedra chains by Ga atoms leads to an expansion of the lattice, a reduction of the lattice phonon frequencies and thus to narrower emission bands.

According to a preferred embodiment of the present invention, RE is selected out of the group comprising Ce, Eu or mixtures thereof. In this context it is especially preferred that Eu is divalent (if present) and/or Ce is trivalent (if present).

According to a preferred embodiment of the present invention, the ratio (in mole:mole) of Europium and Cerium is $\geq 1:0.5$ and $\leq 1:10$, preferably $\geq 1:1$ and $\leq 1:3$, more preferred $\geq 1:1.5$ and $\leq 1:3$. This has been shown to be advantageous for a wide range of applications within the present invention.

According to a preferred embodiment of the present invention, the RE doping level is $\geq 0.05\%$ and $\leq 10\%$.

This has been shown to lead to a material with further improved lighting features for a wide range of application within the present invention. Preferably, the doping level is $\geq 0.2\%$ and $\leq 3\%$, more preferred $\geq 0.75\%$ and $\leq 2\%$.

According to a preferred embodiment of the present invention, x is $\geq 0.01$ and $\leq 0.2$, preferably $\geq 0.05$ and $\leq 0.1$. This has been found to be advantageous for a wide range of applications within the present invention.

Without being bound to any theory, the inventors believe that with an increase of x a so called "flux effect" is also increased, which lowers the reaction temperatures needed to manufacture the inventive material.

However, an increase of x is also believed to widen the half-width of the emission band. This may be advantageous for some application within the present invention, especially if the material is doped with Ce(III) because a broad emission band in the green to amber spectral region is especially useful for a luminescent material used as color converter in white phosphor converted LEDs.

According to a preferred embodiment of the present invention, the photostability of the material is $\geq 80\%$, preferably $\geq 90\%$.

The term "photostability of X %" means and/or includes that if the material is irradiated with blue light at a flux density of 12 W/cm$^2$ and a phosphor temperature of 260° C., after 1 hour the intensity of luminescence is X % of the initial intensity.

The present invention furthermore relates to the use of the inventive material as a luminescent material.

The present invention furthermore relates to a light emitting material, especially a LED, comprising at least one material as described above.

Preferably the at least one material is provided as powder and/or as ceramic material.

If the at least one material is provided at least partially as a powder, it is especially preferred that the powder has a $d_{50}$ of $\geq 5$ μm and $\leq 15$ μm. Here, $d_{50}$ denotes a particle size, where 50% of the particles have a smaller (or larger) size as the $d_{50}$-value. This has been shown to be advantageous for a wide range of applications within the present invention.

According to a preferred embodiment of the present invention, the at least one material is at least partly provided as at least one ceramic material.

The term "ceramic material" in the sense of the present invention means and/or includes especially a crystalline or polycrystalline compact material or composite material with a controlled amount of pores or which is pore free.

The term "polycrystalline material" in the sense of the present invention means and/or includes especially a material with a volume density larger than 90 percent of the main constituent, consisting of more than 80 percent of single crystal domains, with each domain being larger than 0.5 μm in diameter and having different crystallographic orientations. The single crystal domains may be connected by amorphous or glassy material or by additional crystalline constituents.

According to a preferred embodiment, the at least one ceramic material has a density of $\geq 90\%$ and $\leq 100\%$ of the theoretical density. This has been shown to be advantageous for a wide range of applications within the present invention since then the luminescence and optical properties of the at least one ceramic material may be increased.

More preferably the at least one ceramic material has a density of $\geq 97\%$ and $\leq 100\%$ of the theoretical density, yet more preferred $\geq 98\%$ and $\leq 100\%$, even more preferred $\geq 98.5\%$ and $\leq 100\%$ and most preferred $\geq 99.0\%$ and $\leq 100\%$.

According to a preferred embodiment of the present invention, the surface roughness RMS (disruption of the planarity of a surface; measured as the geometric mean of the difference between highest and deepest surface features) of the surface(s) of the at least one ceramic material is $\geq 0.001$ μm and $\leq 5$ μm.

According to an embodiment of the present invention, the surface roughness of the surface(s) of the at least one ceramic material is $\geq 0.005$ μm and $\leq 0.8$ μm, according to an embodiment of the present invention $\geq 0.01$ μm and $\leq 0.5$ μm, according to an embodiment of the present invention $\geq 0.02$ μm and $\leq 0.2$ μm. and according to an embodiment of the present invention $\geq 0.03$ μm and $\leq 0.15$ μm.

According to a preferred embodiment of the present invention, the specific surface area of the at least one ceramic material is $\geq 10^{-7}$ m$^2$/g and 0.1 m$^2$/g.

A material and/or a light emitting device according to the present invention may be of use in a broad variety of systems and/or applications, amongst them one or more of the following:

Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

BRIEF DESCRIPTION OF THE DRAWINGS

Additional details, features, characteristics and advantages of the object of the invention are disclosed in the subclaims, the figures and the following description of the respective figures and examples, which—in an exemplary fashion— show several embodiments and examples of a at least one ceramic material for use in a light emitting device according to the invention as well as several embodiments and examples of a light emitting device according to the invention.

The invention will be further understood by the following Examples I and II which—in a merely illustrative fashion—shows several materials of the present invention.

EXAMPLE I

FIGS. 1 to 4 refer to $SrAlSi_4N_7$:Eu(2%) which was made according to the following:

$SrAlSi_4N_7$:Eu(2%) was prepared by mixing Sr metal powder (0.49 mol, 42.9 g), Eu metal powder (0.01 mol, 1.52 g), $Si_3N_4$ (grain size <500 nm; 0.67 mol, 93.5 g) and AlN (1.0 mol, 41.0 g). The educts are heated in dry $N_2$ atmosphere in tungsten crucibles according to the following heating profile:

room temperature→3 h→1630° C.→5 h→1630° C.→10 h→900° C.→45 min→RT

After firing, the phosphor powder is milled by ball milling and washed with water.

EXAMPLE II

Figure 5:
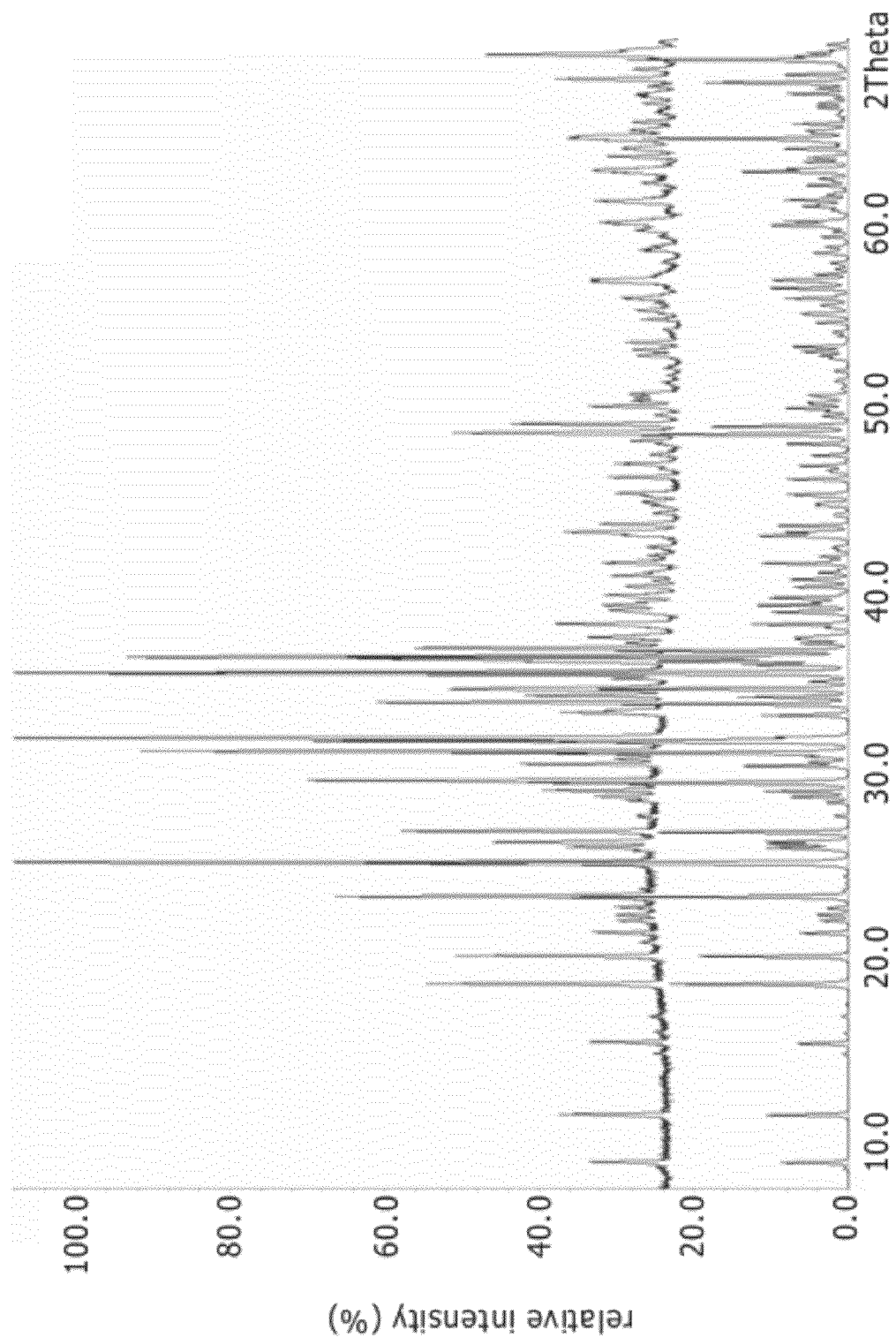
FIG. 5 shows a diagram of a Measured (above) and calculated (below) XRD pattern of a material according to a second example of the present invention.
Figure 6:
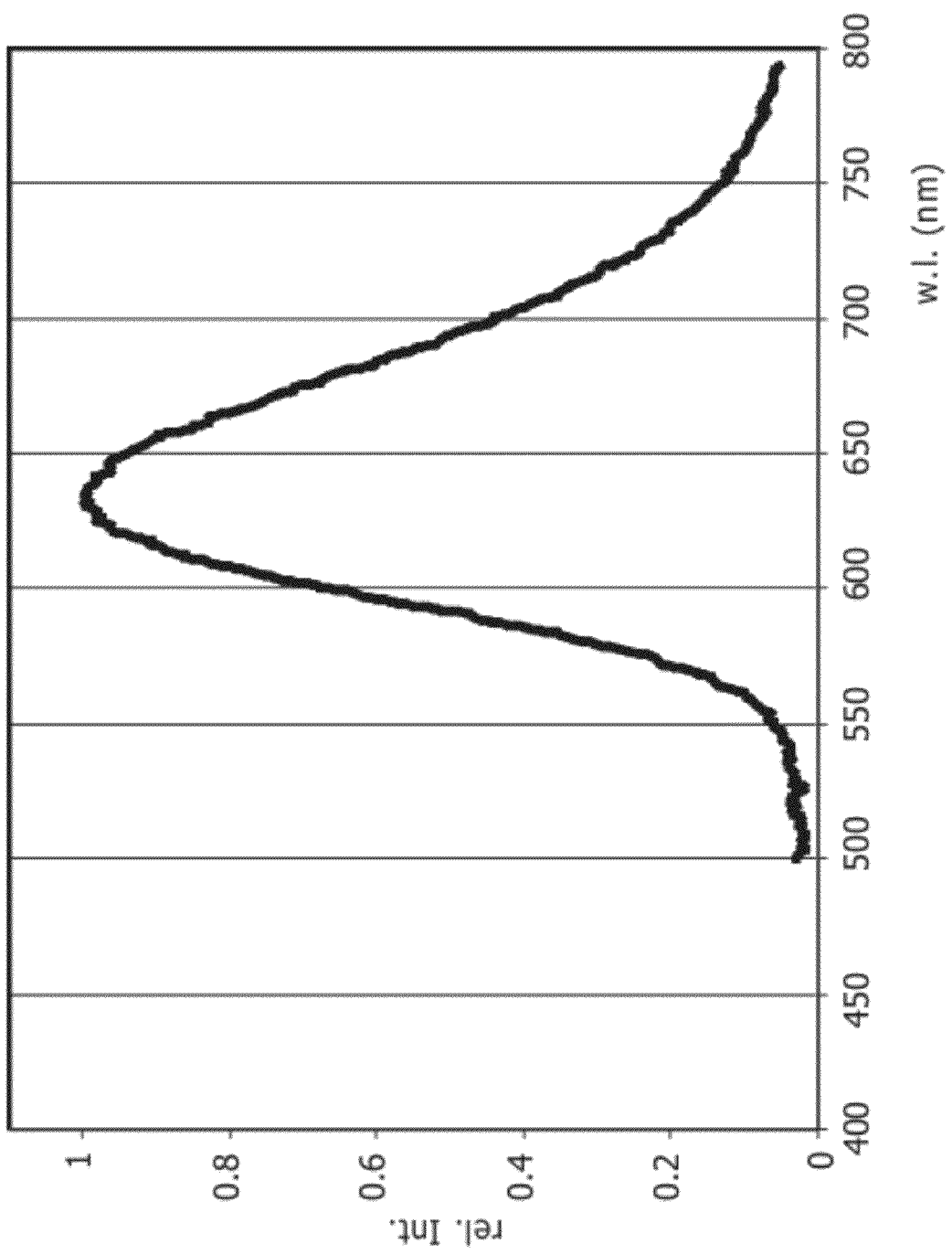
FIG. 6 shows a Emission spectrum (450 nm excitation) of a material according to a second example of the present invention.

FIGS. 5 and 6 refer to $SrAlSi_4N_7$:Eu(3%) which was made analogous to $SrAlSi_4N_7$:Eu(2%) (cf. Example I)

Figure 1:
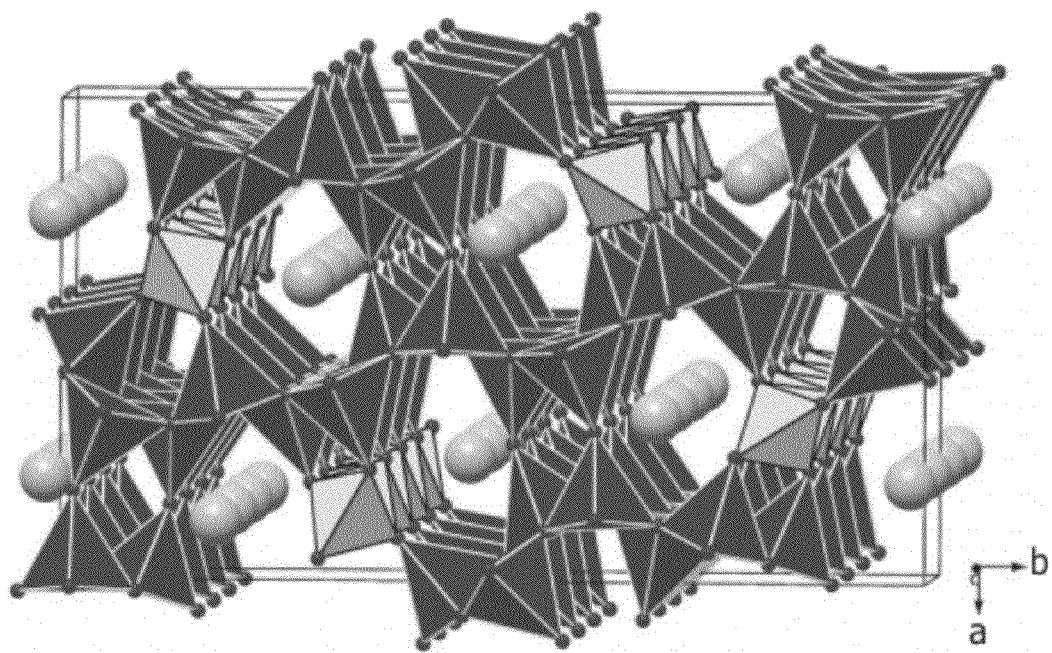
FIG. 1 shows a schematic perspective partial view of a structure of a host material according to a first example of the present invention.
Figure 2:
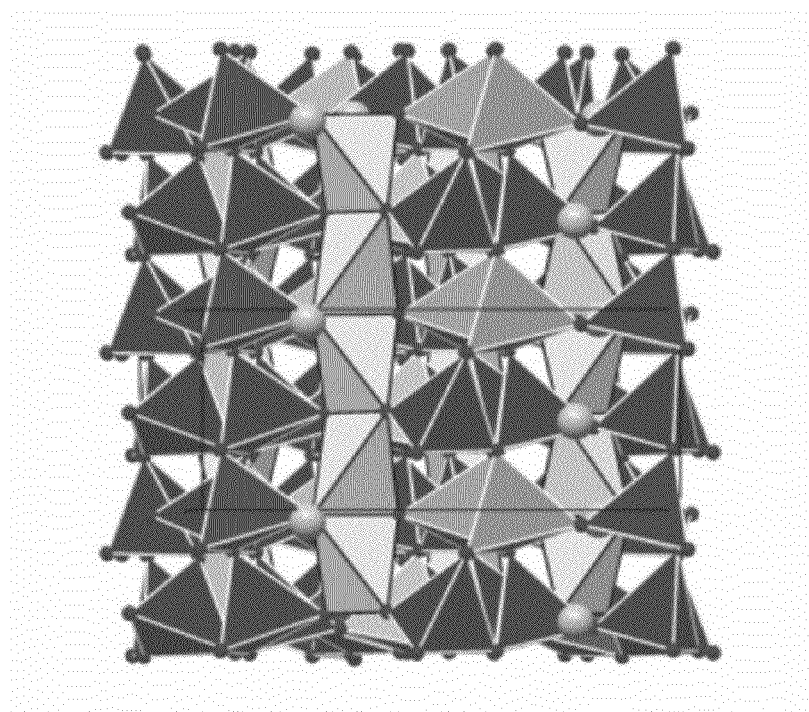
FIG. 2 shows the structure of FIG. 1 from a further perspective.

FIG. 1 shows a schematic perspective partial view of the host material of the structure of Example I, i.e. $SrAlSi_4N_7$, FIG. 2 shows the same structure from another perspective. It can be clearly seen, how the $SiN_4$ and $AlN_4$ tetraeders form lattices.

The exact crystal data can be seen in Table I:

TABLE 1

Crystal data of $SrAlSi_4N_7$.

| | |
|---|---|
| chemical formula | $SrAlSi_4N_7$ |
| molar mass/g·mol$^{-1}$ | 325.03 |
| crystal system | orthorhombic |
| space group | $Pna2_1$ (No. 33) |
| lattice parameters/pm | a = 1174.2(2), b = 2139.1(4), c = 496.6(1) |
| cell volume/$10^6$ pm$^3$ | 1247.2(4) |
| formula units in unit cell | 4 |

Figure 3:
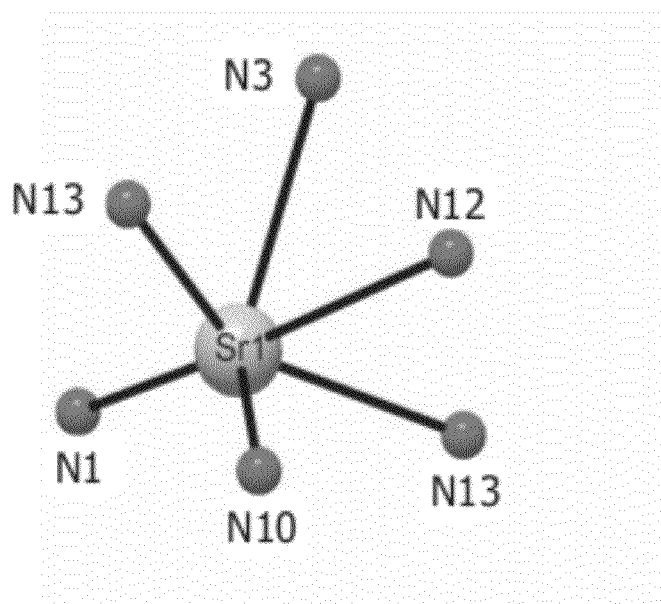
FIG. 3 shows a schematical view of the M(1)-site in the structure of the host material according to a first example of the present invention.
Figure 4:
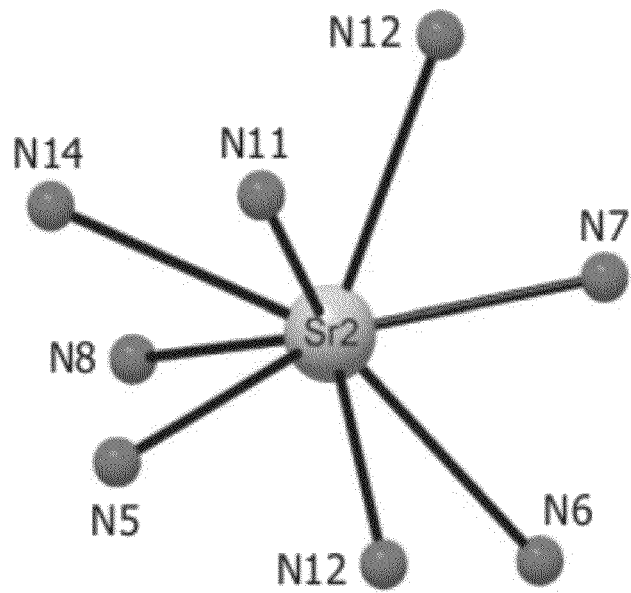
FIG. 4 shows a schematical view of the M(2)-site in the structure of the host material according to a first example of the present invention.

FIG. 3 and FIG. 4 show the M(1) and M(2)-sites in the material of example I, i.e. $SrAlSi_4N_7$:Eu(2%). It can be clearly seen that the two sites are different which has the believed effects as described above.

The exact data for the host material (i.e. the undoped $SrAlSi_4N_7$) is given in Table II:

TABLE II atomic distances (pm) between M atoms and N ligands for $SrAlSi_4N_7$.

| | | | | | |
|---|---|---|---|---|---|
| Sr1—N1 | 250.3(5) | Sr1—N13 | 257.1(8) | Sr1—N10 | 263.4(6) |
| Sr1—N13 | 270.1(8) | Sr1—N3 | 272.3(5) | Sr1—N12 | 314.2(5) |
| Sr2—N12 | 265.3(7) | Sr2—N8 | 270.9(5) | Sr2—N7 | 271.6(6) |
| Sr2—N11 | 282.1(6) | Sr2—N14 | 297.9(6) | Sr2—N12 | 301.1(7) |
| Sr2—N5 | 302.4(6) | Sr2—N6 | 305.7(6) | | |

FIG. 5 shows the measured and calculated XRD patterns (Cu-kαradiation) of $SrAlSi_4N_7$:Eu (3%) indicating that a nearly phase pure material was prepared.

FIG. 6 shows the emission spectrum of $SrAlSi_4N_7$:Eu(3%) after excitation at 450 nm. A typical $Eu^{2+}$ 5d→4f emission band is observed in the red spectral region.

As a comparison the spectroscopic properties of an inventive material is compared with prior art red phosphors in Table III:

TABLE III

Spectroscopic data of inventive and prior art materials.

| Phosphor | Column 1 | Column 2 | LE (lm/W) | Rel. $QE_{450}$ (%) | $\lambda_{max}$ (nm) | FWHM (nm) |
|---|---|---|---|---|---|---|
| $SrAlSi_4N_7$: Eu (INVENTIVE) | 0.636 | 0.362 | 177 | 100% | 634 | 100 |
| $(Ba, Sr)_2Si_5N_8$: Eu (COMPARISON) | 0.613 | 0.386 | 242 | 93% | 620 | 95 |
| $CaSiAlN_3$: Eu (COMPARISON) | 0.668 | 0.332 | 118 | 97% | 649 | 98 |

It can be seen that the inventive material shows comparable, sometimes even improved lighting properties as compared with the comparative materials. The value given under column 1 and 2 of table III denote the values for the x- and y-color coordinates in the CIE diagram, respectively.

A warm white emitting pcLED light source may be built up by combining the inventive material with e.g. a yellow emitting $Y_{3-x}Al_5O_{12}$:$Ce_x$ color converting material and a blue emitting AlInGaN pump LED.

As a further—merely illustrative—example, 10-20 wt % of $SrAlSi_4N_7$:Eu were mixed with 80-90 wt % $Y_3Al_5O_{12}$:Ce, suspended in a silicone resin and deposited on top of an AlInGaN LED die emitting at 440-460 nm. The composition and thickness of the phosphor layer was adjusted to realize a white pcLED lamp with a correlated color temperature of 3200K.

Table IV compares the efficiency and color rendering properties of such a lamp with comparative examples that are built up with prior art red phosphors. It is shown that the claimed phosphor system allows the fabrication of white LED lamps that combine both, a high luminous efficiency and an illumination grade color rendering. Ra is the average color rendering index, R9 is the color rendering index of "red".

TABLE IV

Efficiency and color rendering properties

| Red phosphor component | Rel. luminous efficiency | Ra | R9 |
|---|---|---|---|
| $SrAlSi_4N_7$:Eu (INVENTIVE) | 89% | 79 | 15 |
| $(Ba,Sr)_2Si_5N_8$:Eu (COMPARISON) | 100% | 70 | — |

TABLE IV-continued

| Efficiency and color rendering properties | | | |
|---|---|---|---|
| Red phosphor component | Rel. luminous efficiency | Ra | R9 |
| CaSiAlN$_3$:Eu (COMPARISON) | 77% | 90 | 70 |

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A light emitting device comprising:
a wavelength converting material of the formula $M_{1-y}A_{1+x}Si_{4-x}N_{7-x-2y}O_{x+2y}$:RE, wherein:
M is selected out of the group comprising Ba, Sr, Ca, Mg or mixtures thereof;
A is selected out of the group comprising Al, Ga, B or mixtures thereof;
RE is selected out of the group comprising rare earth metals, Y, La, Sc or mixtures thereof;
x is $\geqq 0$ and $\leqq 1$ and y is $\geqq 0$ and $\leqq 0.2$;
the RE doping level is $\geqq 0.05\%$ and $\leqq 10\%$; and
the wavelength converting material is provided as a ceramic.

2. The light emitting device of claim 1 wherein the ceramic is $\geqq 90\%$ of a theoretical density.

3. The light emitting device of claim 1 wherein the ceramic is $\geqq 97\%$ of a theoretical density.

4. The light emitting device of claim 1 wherein the ceramic has a surface with a surface roughness RMS of $\geqq 0.001$ μm.

5. The light emitting device of claim 1 wherein the ceramic has a surface with a surface roughness RMS of $\leqq 5$ μm.

6. The light emitting device of claim 1 wherein the ceramic has a surface with a surface roughness RMS of $\geqq 0.01$ μm.

7. The light emitting device of claim 1 wherein the ceramic has a surface with a surface roughness RMS of $\leqq 0.5$ μm.

8. The light emitting device of claim 1 wherein the ceramic has a specific surface area of $\geqq 10^{-7}$ m$^2$/g.

9. The light emitting device of claim 1 wherein the ceramic has a specific surface area of $\leqq 0.1$ m$^2$/g.

10. The light emitting device of claim 1 further comprising an LED, wherein the ceramic is disposed in a path of light emitted by the LED.

11. The light emitting device of claim 10 wherein the LED emits light at 440 to 460 nm.

12. The light emitting device of claim 10 wherein the LED emits blue light and the wavelength converting material emits red light.

13. The light emitting device of claim 12 further comprising a phosphor that emits yellow light.

14. The light emitting device of claim 1 wherein RE is one of Eu, Ce, and mixtures thereof.

15. The light emitting device of claim 1 wherein the photostability of the wavelength converting material is $\geqq 80\%$.

16. The light emitting device of claim 1 wherein the photostability of the wavelength converting material is $\geqq 90\%$.

17. The light emitting device of claim 1 wherein the wavelength converting material is configured to emit red light.

* * * * *